United States Patent
Hammer et al.

(10) Patent No.: US 6,773,621 B2
(45) Date of Patent: Aug. 10, 2004

(54) PIEZOELECTRIC CERAMIC MATERIAL, METHOD FOR PRODUCTION THEREOF AND ELECTROCERAMIC MULTI-LAYER COMPONENT

(75) Inventors: Marianne Hammer, Stuttgart (DE); Marc Kuehlein, Gerlingen (DE); Horst Boeder, Biberbach (DE)

(73) Assignee: Robert Bosch GmbH, Stuttgart (DE)

( * ) Notice: Subject to any disclaimer, the term of this patent is extended or adjusted under 35 U.S.C. 154(b) by 23 days.

(21) Appl. No.: 10/221,403

(22) PCT Filed: Dec. 13, 2001

(86) PCT No.: PCT/DE01/04694
§ 371 (c)(1),
(2), (4) Date: Jan. 9, 2003

(87) PCT Pub. No.: WO02/055450
PCT Pub. Date: Jul. 18, 2002

(65) Prior Publication Data
US 2003/0168624 A1 Sep. 11, 2003

(30) Foreign Application Priority Data
Jan. 12, 2001 (DE) .......................................... 101 01 188

(51) Int. Cl.[7] ............................................. C04B 35/491
(52) U.S. Cl. ............................... 252/62.9 PZ; 501/134; 501/135; 501/136; 310/311; 310/365
(58) Field of Search .................... 252/62.9 PZ; 501/134, 501/135, 136; 310/365, 311

(56) References Cited
U.S. PATENT DOCUMENTS

| | | | | |
|---|---|---|---|---|
| 3,649,540 A | * | 3/1972 | Nishida et al. ........ | 252/62.9 PZ |
| 3,654,160 A | * | 4/1972 | Ohno et al. ........... | 252/62.9 PZ |
| 3,963,631 A | * | 6/1976 | Ouchi et al. .......... | 252/62.9 PZ |
| 4,565,642 A | * | 1/1986 | Jyomura et al. ....... | 252/62.9 PZ |
| 6,391,814 B1 | * | 5/2002 | Tsubokura et al. .......... | 501/136 |

FOREIGN PATENT DOCUMENTS

| | | |
|---|---|---|
| DE | 196 15 695 | 7/1997 |
| DE | 198 40 488 | 3/1999 |
| DE | 100 41 905 | 3/2001 |
| EP | 0 619 279 | 11/1997 |
| WO | 97 40537 | 10/1997 |
| WO | 99 12865 | 3/1999 |

OTHER PUBLICATIONS

Sheng–Yuan Chu, Cheng–Sung Hsieh: "Doping Effects On The Piezoelectric Properties Of Low–Temperature Sintered PNN–PZT–Based Ceramics" Journal of Material Science Letters, Bd. 19, No. 4, 200, pp. 609–612.

Shrout T. R. et al: "Conventionally Prepared Submicrometer Lead–Based Perovkite Powders By Reactive Calcination", Journal of the American Ceramic Society, American Ceramic Society, Bd. 73, Nr. 7, Jul. 1, 1990, pp. 1862–7820.

* cited by examiner

*Primary Examiner*—C. Melissa Koslow
(74) *Attorney, Agent, or Firm*—Kenyon & Kenyon

(57) ABSTRACT

A piezoelectric ceramic material having the molar composition

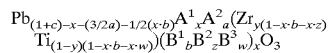

$$Pb_{(1+c)-x-(3/2a)-1/2(x \cdot b)} A^1_x A^2_a (Zr_{y(1-x-b-xz)} Ti_{(1-y)(1-x-b-xw)})(B^1_b B^2_z B^3_w)_x O_3$$

where $A^1$ is selected from the group Ca, Mg, Sr, Ba, or their mixtures, $A^2$ is selected from the group of rare-earth elements or their mixtures, $B^1$ is selected from the group Nb, Ta, or Sb or their mixtures, $B^2$ is Cu or a mixture of Cu with at least one element selected from the group Zn, Ni, Co, or Fe, and $B^3$ is Fe, and where the following applies: $0.001 \leq a \leq 0.05$; $0.05 \leq b \leq 0.90$; $0 \leq c \leq 0.04$; $0.005 \leq x \leq 0.03$; $0.5 \leq y \leq 0.55$; $0.05 \leq z \leq 0.90$; $0 \leq w \leq 0.5$. Furthermore, an electroceramic multilayer component is described having insulating layers containing such a material. Two manufacturing methods are described for the ceramic material, metal ions being introduced as powdered oxides and/or carbonates, mixed together, and calcined to form the ceramic material, or powdered $ZrO_2$ and $TiO_2$ is calcined to form $Zr_y Ti_{1-y} O_2$ where $0.50 < y < 0.55$, the $Zr_y Ti_{1-y} O_2$ is processed to form a powder and mixed with powdered oxides and/or powdered carbonates of the additional metal ions, and this mixture is then calcined to form the ceramic material.

21 Claims, No Drawings

PIEZOELECTRIC CERAMIC MATERIAL, METHOD FOR PRODUCTION THEREOF AND ELECTROCERAMIC MULTI-LAYER COMPONENT

FIELD OF THE INVENTION

The present invention relates to a piezoelectric ceramic material, a method of manufacturing the piezoelectric ceramic material, and to an electroceramic multilayer component having such a piezoelectric ceramic material.

BACKGROUND INFORMATION

Piezoelectric ceramics which are used in actuators, for example, are often manufactured using lead zirconate titanate (PZT) mixed crystal. If suitable additives or dopants are used, these piezoelectric ceramics have advantageous property combinations such as high temperature resistance, high piezoelectric charge constant, high Curie temperature, low dielectric constant, and low coercive field intensity. It is, however, disadvantageous that some of the maximally achievable and desired properties of these PZT ceramics are not obtained when conventional additives are used.

Considering a PZT structure as an $A^{2+}B^{4+}O^{2-}_3$ structure, ceramics which undergo A or B site substitution by a higher-valency cation (donor) are designated "soft ceramics." This substitution produces lead vacancies, so that such ceramics have primarily a high piezoelectric charge constant, high dielectric constant, high dielectric and mechanical loss, low coercive field intensity, and easy polarizability. Typical additives producing these properties include, for example, $La^{3+}$ or, in general, oxides of the rare-earth elements or also $Bi^{3+}$ for A site substitution. $Ta^{5+}$, $Nb^{5+}$, $W^{6+}$, or $Sb^{5+}$ may be considered for B site substitution.

On the other hand, PZT ceramics which undergo A or B site substitution by a lower valency cation (acceptor) are, designated "hard ceramics." In this case, oxygen vacancies are produced, so that such ceramics have a low piezoelectric charge constant, low dielectric and mechanic loss, high coercive field intensity, and low electrical resistance. Furthermore, such ceramics are usually difficult to polarize. Typical additives inducing such properties in-such "hard ceramics" are, for example, $K^{1+}$ or $Na^{1+}$ for A site substitution. Primarily $Ni^{2+}$, $Zn^{2+}$, $Co^{2+}$, $Fe^{3+}$, $Sc^{3+}$, or $Mg^{2+}$ may be considered for B site substitution.

In summary, primarily materials having a combination of the properties of "soft ceramics" and "hard ceramics" are relevant for use in a piezoelectric actuator as PZT ceramics. In particular, it is advantageous if the piezoelectric charge constant and the Curie temperature are as high as possible, i.e., $d_{33}>500 \cdot 10^{12}$ m/V and $T_c>300°$ C., and if the dielectric constant of the material obtained is as low as possible, i.e., if $\epsilon_{33}/\epsilon_0$ is less than 2000.

In order to meet these requirements, it has been proposed that the PZT ceramic be codoped, resulting in the formation of both Pb vacancies and oxygen vacancies. Thus, German Patent Application No. 196 15 695 proposes that the surface of pure donor-doped PZT green ceramics be provided with an $Ag_x/Pd_{1-x}$ paste (x=0.7) and that these ceramics be stacked, with silver diffusing into the adjacent ceramic layers in a subsequent joint sintering (cofiring) of the green ceramic which has the Ag/Pd paste and being built into an A site as an acceptor. Furthermore, European Patent No. 0 619 279 proposes that doping be performed using complex compounds having the general formula $A(B^1_{1-x}B^2_x)$ where A=Pb and $B^1$=monovalent, bivalent, or trivalent cations, and $B^2$=trivalent, pentavalent, or hexavalent cations, i.e., compounds of the type $A(W_{1/3}Ni_{2/3})O_3$ or $A(Mg_{1/3}Nb_{2/3})O_3$, for example, where A may be lead, strontium, calcium, or barium.

Additionally, Published PCT International Application No. 99/12865 proposes doping a PZT ceramic with lead-free complex compounds which have a Perowski structure like the PZT mixed crystal and which react to yield a single-phase mixed crystal when added in small amounts and jointly calcined. Such compounds have the general composition $A^{2+}B^1_{0.25}{}^+B^2_{0.75}{}^{5+}O_3$ where A=barium and/or strontium, $B^1$=potassium and/or sodium, and $B^2$=niobium, tantalum, or antimony. The disclosed required sintering temperatures for producing an electroceramic multilayer component having such a piezoelectric ceramic material are below 1150° C.

SUMMARY OF THE INVENTION

An object of the present invention is to provide a piezoelectric ceramic material having the highest possible thermal stability, piezoelectric charge constant, and Curie temperature, and the lowest possible dielectric constant, electromechanical losses, and also a low coercive field intensity, and a low electrical conductivity. Furthermore, another object is to provide a material sinterable at temperatures below 1000° C. so that by using this material a more cost-effective internal electrode paste could be used in the manufacture of electroceramic multilayer components.

The piezoelectric ceramic material according to an embodiment of the present invention has the advantage over the related art in that it has a high thermal stability, a piezoelectric charge constant $d_{33}$ greater than $500 \cdot 10^{12}$ m/V, a Curie temperature $T_c$ higher than 300° C., a dielectric constant $\epsilon_{33}/\epsilon_0$ less than 2000, and a coercive field intensity less than 1.2 kV/mm with low electromechanical losses, and low electrical conductivity. Furthermore, this piezoelectric ceramic material is sinterable, for example, together with copper-based or $Ag_tPd_{1-t}$-based electrode paste layers (where $t \geq 0.7$ and t is the proportion by weight) at temperatures below 1000° C. in a cofiring process to yield an electroceramic multilayer component. The sintering may advantageously take place in the presence of an air, nitrogen, or a nitrogen-containing gas atmosphere.

According to a particular embodiment, this lower sintering temperature allows the use of a silver-palladium mixture as the material for the electrode paste layers, whose Ag content is considerably greater than 70% by weight and is less expensive than platinum-based internal electrode materials, for example, or internal electrodes having a higher palladium content.

The use of precious metal-free electrode paste layers, i.e., precious metal-free pastes such as copper pastes, for example, offers considerable cost advantages. Additionally, an undesirable diffusion of copper from the internal electrode layers into the adjacent ceramic material can be avoided at the same time by adding copper oxide to the piezoelectric ceramic material as an additive or dopant. In this case, the PZT ceramic is already saturated with copper ions due to the copper oxide addition to the PZT ceramic. In addition, the possibility of using copper as an alternative to silver/palladium limits the dependence of the price of the resulting electroceramic multilayer components on the highly speculative prices of palladium and platinum.

In a method of manufacturing the piezoelectric ceramic material according to the present invention, it is advantageous that all additives and dopants used in addition to lead, zirconium, and titanium may be used as powdered oxides or carbonates, which are available at a reasonable cost and in large quantities.

Thus, it is advantageous to add copper in the form of a $Cu^{1+}$ and/or $Cu^{2+}$ ion as a dapant to the piezoelectric ceramic material, which allows sintering of the green ceramic, to which this material is added as a ceramic component together with a copper-containing electrode paste layer, in the presence of an air, nitrogen, or a nitrogen-containing atmosphere possible.

The piezoelectric material obtained may also have either a stoichiometric composition or a composition containing a lead oxide, in particular PbO, in a stoichiometric excess, which causes a further reduction in the sintering temperature.

In addition, a castable slurry or an extrudable compound for the manufacture of green ceramics can be produced conveniently as is known by those skilled in the art.

DETAILED DESCRIPTION

The present invention employs a lead zirconate titanate-based (PZT) piezoelectric ceramic material having the general composition $A^{2+}B^{4+}O^{2+}_3$, which is codoped using donors and acceptors. This codoping is achieved by the addition of powdered oxides and/or powdered carbonates containing the corresponding metal ions and takes place at both the $A^{2+}$ sites and $B^{4+}$, sites of the PZT ceramic. In this manner, the overall defect concentration remains low in the piezoelectric ceramic material obtained due to a compensation of charges between the lead vacancies and the oxygen vacancies, which enhances the stability of its structure and thus the piezoelectric activity and thermal stability. In the stoichiometric case, the general formula of the piezoelectric ceramic material is the following:

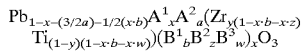

where $A^1$ is selected from the group Ca, Mg, Sr, Ba, or their mixtures; $A^2$ is selected from the group of rare-earth elements, in particular La, or their mixtures; B is selected from the group Nb, Ta, or Sb, or their mixtures; $B^2$ is Cu or a mixture of Cu with at least one element selected from the group Zn, Ni, Co, or Fe, and $B^3$ is Fe, under the condition that the following applies to a, b, c, x, y, z, and w:

$0.001 \leq a \leq 0.05$ $0.05 \leq b \leq 0.90$ $0.005 \leq x \leq 0.03$ $0.5 \leq y \leq 0.55$ $0.05 \leq z \leq 0.90$ $0 \leq w \leq 0.5.$ The numerical values for a, b, x, y, z, and w are always to be understood as referring to mols.

As an alternative to the above composition, a lead oxide, in particular PbO, may be added in stoichiometric excess, so that the piezoelectric ceramic material obtained has a non-stoichiometric overall composition. In this case, the general formula of the piezoelectric ceramic material is:

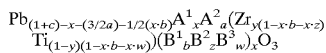

where $A^1$, $A^2$, $B^1$, $B^2$, and $B^3$ are as above and under the condition that the following applies to a, b, c, x, y, z, and w:

$0.001 \leq a \leq 0.05$ $0.05 \leq b \leq 0.90$ $0 \leq c \leq 0.04$ $0.005 \leq x \leq 0.03$ $0.5 \leq y \leq 0.55$ $0.05 \leq z \leq 0.90$ $0 \leq w \leq 0.5.$ Thus, in the stoichiometric case, the condition c=0 applies to the piezoelectric ceramic material obtained, while in the non-stoichiometric case, the condition $0.005 \leq c \leq 0.04$ applies for c.

In one embodiment of the piezoelectric ceramic material, which is particularly well-suited for application in piezoelectric actuators, is a material of the formula

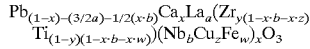

where $0.0025 \leq a \leq 0.01$ $0.5 \leq b \leq 0.9$ $0.01 \leq x \leq 0.025$ $0.05 \leq w \leq 0.3$ $0.51 \leq y(1-(x \cdot b)-(x \cdot z)) \leq 0.55$ $0.45 \leq (1-y)(1-(x \cdot b)-(x \cdot w)) \leq 0.49$ $0.05 \leq w \leq 0.3.$ It should be emphasized here that the oxygen content in all the above formulas of the piezoelectric ceramic material-as a result of oxygen vacancies incorporated or generated by sintering is usually to be described as $O_{3-\delta}$ rather than exactly as $O_3$, where $\delta$ is less than 0.01, in particular less than 0.004. Since the formation of oxygen vacancies always occurs in such materials, and it is not accurately measurable within the above limits, it is to be understood that the formula

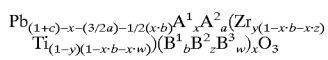

represents a material having oxygen vacancies within the above-mentioned limits.

Specific embodiments of the materials according to the above-mentioned formulas include:

where x=0.02, a=0.005, y=0.53, b=0.75, z=0.1, c=0, and w=0.15, with δ less than 0.004.

where x=0.02, a=0.002, y=0.53, b=0.85, z=0.05, c=0, and w=0.1, with δ less than 0.004.

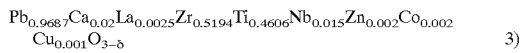

where x=0.02, a=0.0025, y=0.53, b=0.75, z=0.25, c=0, and w=0, with δ less than 0.004.

$$Pb_{0.9678}Ca_{0.018}La_{0.005}Zr_{0.5203}Ti_{0.4614}Nb_{0.0135}Zn_{0.003}Cu_{0.018}O_{3-\delta} \quad 4)$$

where x=0.02, a=0.0025, y=0.53, b=0.75, z=0.25, c=0, and w=0, with δ less than 0.004.

$$Pb_{0.9978}Ca_{0.018}La_{0.005}Zr_{0.5203}Ti_{0.4614}Nb_{0.0135}Zn_{0.003}Cu_{0.018}O_{3-\delta} \quad 5)$$

where x=0.02, a=0.0025, y=0.53, b=0.75, z=0.25, c=0.03, and w=0, with δ less than 0.004.

$$Pb_{0.9878}Ca_{0.02}La_{0.0025}Zr_{0.2}Ti_{0.46}Nb_{0.015}Zn_{0.002}Co_{0.002}Cu_{0.001}O_{3-\delta} 6)$$

where x=0.02, a=0.0025, y=0.53, b=0.75, z=0.25, c=0.02, and w=0, with δ less than 0.004.

In order to further process such a piezoelectric ceramic material into an electroceramic multilayer component, such as a piezoelectric actuator, a thermistor, or a capacitor, having a plurality of insulating layers arranged one above the other and made of the piezoelectric ceramic material and internal electrode layers located in some areas between those insulating layers, where the internal electrode layers are made largely of copper or $Ag_t/Pd_{1-t}$ where $t \geq 0.7$, in particular >0.7, or >0.8, one of the above-described materials is initially processed into a castable sludge or an extrudable compound in a known manner and then shaped into a green ceramic using film casting or extrusion. This is then dried and its surface is provided with a layer of a conductive internal electrode paste in some areas. This internal electrode paste may include copper or on one of the above-described silver/palladium mixtures.

After the green ceramics, which have a thickness of 30 μm to 150 μm, for example, are impressed with the conductive internal electrode paste, they are punched, stacked, and laminated, the number of insulating layers having the piezoelectric ceramic material may range between 10 and 500 layers. After lamination, a known cofiring process follows under air, nitrogen, or a nitrogen-containing gas atmosphere at sintering temperatures of less than 1000° C.

In this sintering process, the green ceramics provide the insulating layers and the electrode paste layers provide the internal electrode layers in the electroceramic multilayer component, which then becomes a thick ceramic electrode composite and is usable, for example, as a piezoelectric actuator after the application of an outer contact to the internal electrodes. During sintering, the electrode paste layers are converted into metallic internal electrode layers, which are then at least largely made of copper or the above-described silver/palladium alloy.

The "columbite method" as described by T. R. Shrout et al., J. Am. Ceram. Soc., 73, (7), pp, 1862–1867 (1990), is one process that is suitable for manufacturing the above-described piezoelectric ceramic materials. In that method, powdered zirconium dioxide and powdered titanium dioxide are initially calcined to yield $Zr_yT_{1-y}O_2$, where 0.5<y<0.55 (in mols). The $Zr_yT_{1-y}O_2$ obtained is processed into a powder, and this powder, used later as a precursor, is then mixed with powdered oxides and/or the powdered carbonates of the additional ions of lead, iron, $A^1$, $A^2$, $B^1$, and $B^2$. This powdered mixture is then calcined to yield the piezoelectric ceramic material in the form of a homogeneous PZT mixed crystal. As an alternative, the "mixed oxide" process may also be used as the manufacturing method, i.e., initially all the ions to be used in the piezoelectric ceramic material to be manufactured are first used as powdered oxides and/or powdered carbonates, mixed, and then calcined to form the piezoelectric ceramic material. The amounts of the respective oxides and/or carbonates used are determined by the composition of the resulting piezoelectric ceramic material intended.

What is claimed is:

1. A piezoelectric ceramic material having the following molar composition:

$$Pb_{(1+c)-x-(3/2a)-1/2(x \cdot b)}A^1_x A^2_a (Zr_{y(1-x-b-x \cdot z)} Ti_{(1-y)(1-x \cdot b-x \cdot w)})(B^1_b B^2_z B^3_w)_x O_3,$$

wherein $A^1$ is selected from the group Ca, Mg, Sr, Ba, and a mixture of these elements; $A^2$ is selected from the group of rare-earth elements and a mixture of these elements; $B^1$ is selected from the group Nb, Ta, Sb, and a mixture of these elements; $B^2$ is one of Cu and a mixture of Cu with at least one element selected from the group Zn, Ni, Co, and Fe; and $B^3$ is Fe, where the following apply to values for a, b, c, x, y, z, and w:

$0.001 \leq a \leq 0.05$ $0.05 \leq b \leq 0.90$ $0 \leq c \leq 0.04$ $0.005 \leq x \leq 0.03$ $0.5 \leq y \leq 0.55$ $0.05 \leq z \leq 0.90$ $0 \leq w \leq 0.5.$ 2. The piezoelectric ceramic material according to claim 1, further comprising oxygen vacancies.

3. The piezoelectric ceramic material according to claim 1, wherein $A^2$ includes La.

4. The piezoelectric ceramic material according to claim 1, wherein $0.005 \leq c \leq 0.04$.

5. The piezoelectric material according to claim 1, wherein c=0.

6. The piezoelectric material according to claim 1, wherein $A^1$ is a bivalent ion, $A^2$ is a trivalent ion, $B^1$ is a pentavalent ion, $B^2$ is one of a monovalent ion, a bivalent ion, and a mixture of at least one monovalent ion and at least ones bivalent ion, and $B^3$ is a trivalent Fe ion.

7. The piezoelectric ceramic material according to claim 6, wherein c=0, $A^1$ is Ca, $A^2$ is La, $B^1$ is Nb, and $B^2$ is Cu.

8. The piezoelectric material according to claim 1, wherein the following apply to values for a, b, x, y, z, and w:

$0.0025 \leq a \leq 0.01$ $0.5 \leq b \leq 0.9$ $0.01 \leq x \leq 0.025$ $0.05 \leq w \leq 0.3$ $0.51 \leq y(1-(x \cdot b)-(x \cdot z)) \leq 0.55$ $0.45 \leq (1-y)(1-(x \cdot b)-(x \cdot w)) \leq 0.49$ $0.05 \leq w \leq 0.3.$ 9. An electroceramic multilayer component comprising:
a plurality of insulating layers arranged in a stack including a piezoelectric ceramic material; and
internal electrode layers separating the insulating layers in at least one area, wherein the piezoelectric ceramic material has the following molar composition:

$$Pb_{(1+c)-x-(3/2a)-1/2(x \cdot b)}A^1{}_xA^2{}_a(Zr_{y(1-x \cdot b-x \cdot z)}Ti_{(1-y)(1-x \cdot b-x \cdot w)})(B^1{}_bB^2{}_zB^3{}_w)_xO_3,$$

wherein $A^1$ is selected from the group Ca, Mg, Sr, Ba, and a mixture of these elements; $A^2$ is selected from the group of rare-earth elements and a mixture of these elements; $B^1$ is selected from the group Nb, Ta, Sb and a mixture of these elements; $B^2$ is one of Cu and a mixture of Cu with at least one element selected from the group Zn, Ni, Co, and Fe; and $B^3$ is Fe, where the following applies to values for a, b, c, x, y, z, and w:

$0.001 \leq a \leq 0.05$ $0.05 \leq b \leq 0.90$ $0 \leq c \leq 0.04$ $0.005 \leq x \leq 0.03$ $0.5 \leq y \leq 0.55$ $0.05 \leq z \leq 0.90$ $0 \leq w \leq 0.5$.

10. The electroceramic multilayer component according to claim 9, wherein the component is incorporated in one of a piezoelectric actuator, a thermistor, and a capacitor.

11. The electroceramic multilayer component according to claim 9, wherein the internal electrode layers include one of Cu and $Ag_t/Pd_{1-t}$, wherein $t \geq 0.7$ and t designates proportion by weight.

12. The electroceramic multilayer component according to claim 11, wherein $t \geq 0.7$.

13. The electroceramic multilayer component according to claim 11, wherein the electroceramic multilayer component is manufactured by sintering a stack of green ceramics including the piezoelectric ceramic material, the green ceramics having surfaces separated in at least some areas from one another by electrode paste layers, the sintering being conducted at temperatures below 1000° C. in a cofiring process.

14. A method of manufacturing a piezoelectric ceramic material, the piezoelectric ceramic material having a molar composition of $$Pb_{(1+c)-x-(3/2a)-1/2(x \cdot b)}A^1{}_xA^2{}_a(Zr_{y(1-x \cdot b-x \cdot z)}Ti_{(1-y)(1-x \cdot b-x \cdot w)})(B^1{}_bB^2{}_zB^3{}_w)_xO_3,$$

$A^1$ being selected from the group Ca, Mg, Sr, Ba, and a mixture of these elements; $A^2$ being selected from the group of rare-earth elements and a mixture of these elements; $B^1$ being selected from the group Nb, Ta, Sb, and a mixture of these elements; $B^2$ being one of Cu and a mixture of Cu with at least one element selected from the group Zn, Ni, Co, and Fe; $B^3$ being Fe; and $0.001 \leq a \leq 0.05$, $0.05 \leq b \leq 0.90$, $0 \leq c \leq 0.04$, $0.005 \leq x \leq 0.03$, $0.5 \leq y \leq 0.55$, $0.05 \leq z \leq 0.90$, $0 \leq w \leq 0.5$, the method comprising:

mixing ions of Pb, Zr, Ti, Fe, $A^1$, $A^2$, $B^1$, and $B^2$, the ions of Pb, Zr, Ti, Fe, $A^1$, $A^2$, $B^1$, and $B^2$ being initially introduced in a form of at least one of powdered oxides and carbonates; and calcining the mixture to form the piezoelectric ceramic material.

15. The method according to claim 14, further comprising:

mixing a lead oxide in stoichiometric excess.

16. The method according to claim 15, wherein the lead oxide is PbO.

17. The method according to claim 14, wherein the at least one of powdered oxides and carbonates are mixed so that the piezoelectric ceramic material has a stoichiometric composition.

18. A method of manufacturing a piezoelectric ceramic material, the piezoelectric ceramic material having a molar composition of $$Pb_{(1+c)-x-(3/2a)-1/2(x \cdot b)}A^1{}_xA^2{}_a(Zr_{y(1-x \cdot b-x \cdot z)}Ti_{(1-y)(1-x \cdot b-x \cdot w)})(B^1{}_bB^2{}_zB^3{}_w)_xO_3,$$

$A^1$ being selected from the group Ca, Mg, Sr, Ba, and a mixture of these elements; $A^2$ being selected from the group of rare-earth elements and a mixture of these elements; $B^1$ being selected from the group Nb, Ta, Sb and a mixture of these elements; $B^2$ being one of Cu and a mixture of Cu with at least one element selected from the group Zn, Ni, Co, and Fe; $B^3$ being Fe; and $0.001 \leq a \leq 0.05$, $0.05 \leq b \leq 0.90$, $0 \leq c \leq 0.04$, $0.005 \leq x \leq 0.03$, $0.5 \leq y \leq 0.55$, $0.05 \leq z \leq 0.90$, $0 \leq w \leq 0.5$, the method comprising:

calcining a powdered $ZrO_2$ and a powdered $TiO_2$ to form $Zr_yTi_{1-y}O_2$ where $0.50 < y < 0.55$;

processing the $Zr_yTi_{1-y}O_2$ to form a powder;

mixing the $Zr_yTi_{1-y}O_2$ powder with at least one of powdered oxides and powdered carbonates of the ions Pb, Fe, $A^1$, $A^2$, $B^1$, $B^2$ to form a powder mixture; and calcining the powder mixture to form the piezoelectric ceramic material.

19. The method according to claim 18, further comprising:

mixing a lead oxide in stoichiometric excess.

20. The method according to claim 19, wherein the lead oxide is PbO.

21. The method according to claim 18, wherein the at least one of powdered oxides and carbonates are mixed so that the piezoelectric ceramic material has a stoichiometric composition.

* * * * *

UNITED STATES PATENT AND TRADEMARK OFFICE
CERTIFICATE OF CORRECTION

| | |
|---|---|
| PATENT NO. | : 6,773,621 B2 |
| APPLICATION NO. | : 10/221403 |
| DATED | : August 10, 2004 |
| INVENTOR(S) | : Marianne Hammer et al. |

It is certified that error appears in the above-identified patent and that said Letters Patent is hereby corrected as shown below:

Column 1, line 44, change "properties in-such" to --properties in such--

Column 3, line 6, change "as a dapant" to --as a dopant--

Column 3, line 29, change "$B^{4+}$, sites" to --$B^{4+}$ sites--

Column 4, line 41, change "ceramic material-" to -- ceramic material--

Signed and Sealed this

Fourth Day of July, 2006

JON W. DUDAS
*Director of the United States Patent and Trademark Office*